(12) United States Patent
Chen et al.

(10) Patent No.: US 10,859,440 B2
(45) Date of Patent: Dec. 8, 2020

(54) SPECTROMETER ENGINE AND AN ADJUSTMENT METHOD THEREOF

(71) Applicant: InnoSpectra Corporation, Hsinchu County (TW)

(72) Inventors: Cheng-Hsiung Chen, Hsinchu County (TW); Yung-Yu Huang, Hsinchu County (TW); Ming-Hui Lin, Hsinchu County (TW); He-Yi Hsieh, Hsinchu County (TW); Hsi-Pin Li, Hsinchu County (TW)

(73) Assignee: InnoSpectra Corporation, Hsin-Chu (TW)

(\*) Notice: Subject to any disclaimer, the term of this patent is extended or adjusted under 35 U.S.C. 154(b) by 13 days.

(21) Appl. No.: 16/513,749

(22) Filed: Jul. 17, 2019

(65) Prior Publication Data

US 2020/0033191 A1  Jan. 30, 2020

(30) Foreign Application Priority Data

Jul. 24, 2018 (CN) ............... 2018 1 0816830

(51) Int. Cl.
  *G01J 3/28* (2006.01)
  *H03F 3/08* (2006.01)
(52) U.S. Cl.
  CPC ............ *G01J 3/28* (2013.01); *H03F 3/08* (2013.01); *H03F 2200/129* (2013.01); *H03F 2200/228* (2013.01)
(58) Field of Classification Search
  CPC ...... G01J 1/44; G01J 1/025; G01J 3/28; G01J 3/2803; G01J 3/0297; H03F 3/08;
  (Continued)

(56) References Cited

U.S. PATENT DOCUMENTS 5,684,480 A * 11/1997 Jansson ............... H03M 1/186
  341/139
7,839,502 B2  11/2010 Lukas et al.
  (Continued)

FOREIGN PATENT DOCUMENTS

CN   103512659   1/2014
CN   103983606   8/2014
TW   I439683   6/2014

*Primary Examiner* — Tarifur R Chowdhury
*Assistant Examiner* — Jonathon Cook
(74) *Attorney, Agent, or Firm* — JCIPRNET

(57) ABSTRACT

A spectrometer engine and an adjustment method thereof are provided. The spectrometer engine includes a connector, a light sensor, a variable gain amplifier, a variable reference voltage generation circuit, an analog-to-digital converter and a control circuit. The light sensor senses a light to be measured coming from an object to be measured to generate a sensing signal. The variable gain amplifier amplifies the sensing signal according to a first setting parameter to generate an amplified signal. The variable reference voltage generation circuit provides a reference voltage according to a second setting parameter. The analog-to-digital converter converts the amplified signal to a digital signal according to the reference voltage. The control circuit reads the digital signal and adjusts at least one of the first to third setting parameters according to the digital signal for the spectrometer engine to measure the object to be measured again to generate another digital signal.

25 Claims, 8 Drawing Sheets

(58) Field of Classification Search
CPC ........ H03F 2200/129; H03F 2200/228; G01N 21/31; G01N 21/274; H04B 10/6931
See application file for complete search history.

(56) References Cited

U.S. PATENT DOCUMENTS

| | | |
|---|---|---|
| 8,922,766 B2 | 12/2014 | Nozawa |
| 2005/0162530 A1* | 7/2005 | Matsui .................. H04N 5/378 348/222.1 |
| 2010/0027004 A1* | 2/2010 | Bonyuet .............. G01N 21/274 356/326 |
| 2013/0107260 A1* | 5/2013 | Nozawa ................... G01J 3/26 356/402 |
| 2013/0250294 A1 | 9/2013 | Chalmers |
| 2018/0209845 A1 | 7/2018 | Huang et al. |

* cited by examiner

SPECTROMETER ENGINE AND AN ADJUSTMENT METHOD THEREOF

CROSS-REFERENCE TO RELATED APPLICATION

This application claims the priority benefit of China application serial no. 201810816830.X, filed on Jul. 24, 2018. The entirety of the above-mentioned patent application is hereby incorporated by reference herein and made a part of this specification.

BACKGROUND OF THE INVENTION

Field of the Invention

The disclosure relates to a spectrometer engine and an adjustment method thereof, and more particularly, to a spectrometer engine and an adjustment method thereof that adjust the setting parameters of the elements according to the spectral sampling module connected to the spectrometer engine.

Description of Related Art

In general, the spectrometer is widely used in material analysis applications. The spectrometer may analyze the material with the characteristics (for example, with the wavelength of light) of light being absorbed or reflected by an unknown sample. The common spectrometer may be divided into those measuring the reflected light, measuring the penetrating light and measuring the light to be measured input by the optic fiber. With the different measurement methods, the corresponding intensity of light signal is different, and thus the measurement parameters being used correspondingly are also different.

Therefore, if the spectrometer changes the spectral sampling module, the intensity of the light to be measured strength reaches the light sensor may be different due to different aspect or type of the spectrum sampling module or the absorption rate of the object to be measured. As such, the sensing signal obtained by the conversion of the light sensor may have a different intensity range. In order to fully exert the performance of the spectrometer, the operator has to manually adjust the relevant setting parameters of the gain of the amplifier, the reference voltage generation circuit or the light source control signal, such that the value of the spectrum digital signal read by the control circuit may approach but not exceed the maximum allowable dynamic range.

However, it is neither convenient nor accurate for the operator to manually adjust the above-mentioned setting parameters. Therefore, it is an important issue for persons skilled in the art to design a mechanism that better adjusts the above-mentioned setting parameters.

The information disclosed in this description of related art section is only for enhancement of understanding of the background of the described technology and therefore it may contain information that does not form the prior art that is already known to a person of ordinary skill in the art. Further, the information disclosed in the description of related art section does not mean that one or more problems to be resolved by one or more embodiments of the invention were acknowledged by a person of ordinary skill in the art.

SUMMARY OF THE INVENTION

Other features and advantages of the embodiments of the disclosure are illustrated by the technical features broadly embodied and described as follows.

In order to achieve one or a part of or all of the above purposes or other purposes, the disclosure provides a spectrometer engine and an adjustment method thereof, that automatically adjust relevant setting parameters of a variable gain amplifier, a variable reference voltage generation circuit and a light source control signal so as to improve the above defects in the prior art. In the disclosure, it is not required to manually set the setting parameters, and the disclosure provides a more convenient and accurate parameter adjustment mechanism improve the related operating experience and automatically adjusts the settings to fully exert the performance of the spectrometer engine.

A spectrometer engine and an adjustment method thereof including a connector, a light sensor, a variable gain amplifier, a variable reference voltage generation circuit, an analog-to-digital converter and a control circuit are provided. The connector is adapted for connecting with a replaceable spectral sampling module, wherein the replaceable spectral sampling module samples an object to be measured to generate a light to be measured. The light sensor is adapted for sensing the light to be measured coming from the object to be measured to generate a sensing signal. The variable gain amplifier is coupled to the light sensor and amplifies the sensing signal according to a first setting parameter to generate an amplified signal. The variable reference voltage generation circuit provides a reference voltage according to a second setting parameter. The analog-to-digital converter is coupled to the variable gain amplifier and the variable reference voltage generation circuit and converts the amplified signal to a first digital signal according to the reference voltage. The control circuit is coupled to the variable gain amplifier, the variable reference voltage generation circuit and the analog-to-digital converter. The control circuit reads the first digital signal, adjusts at least one of the first setting parameter, the second setting parameter and a third setting parameter according to the first digital signal, and outputs a light source control signal according to the third setting parameter for the spectrometer engine to measure the object to be measured again to generate a second digital signal.

An adjustment method of a spectrometer engine is provided. The adjustment method of a spectrometer engine includes the following. A replaceable spectral sampling module samples an object to be measured to generate a light to be measured. The light sensor senses a light to be measured coming from an object to be measured to generate a sensing signal. The variable gain amplifier amplifies the sensing signal according to a first setting parameter to generate an amplified signal. The variable reference voltage generation circuit provides a reference voltage according to a second setting parameter. The analog-to-digital converter converts the amplified signal to a first digital signal according to the reference voltage. The control circuit reads the digital signal and adjusts at least one of the first setting parameter, the second setting parameter and a third setting parameter according to the first digital signal, and outputs a light source control signal according to the third setting parameter for the spectrometer engine to measure the object to be measured again to generate a second digital signal.

Based on the above, the disclosure provides a spectrometer engine, which may recursively adjust the setting parameters for the variable gain amplifier and the variable reference voltage generation circuit and for generating the light source control signal by a certain mechanism so as to adjust the above setting parameters to proper values for fully exerting the performance of the spectrometer.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
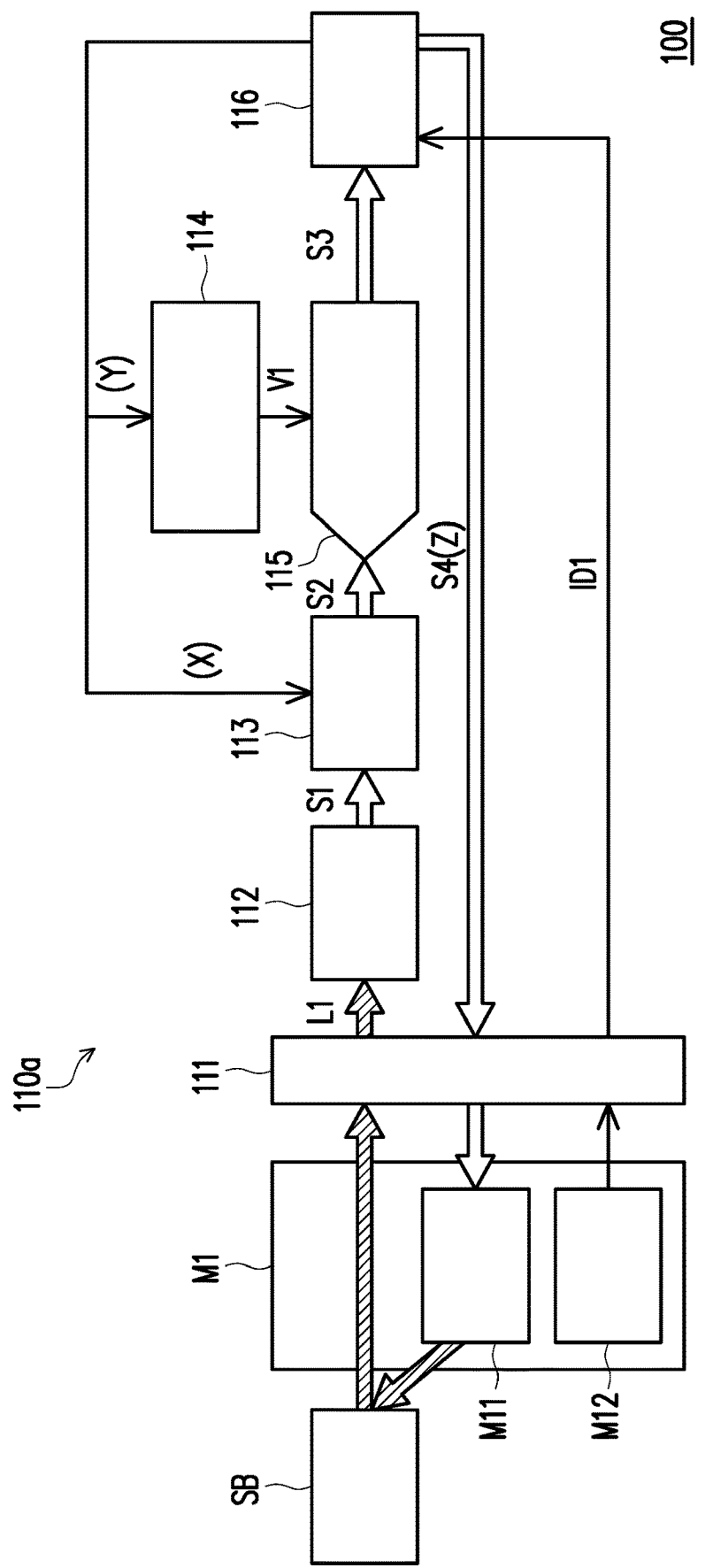
FIG. 1 is a schematic view of measuring a spectrum of an object to be measured with a spectrometer engine accompanied with a reflective sampling module according to an embodiment of the disclosure.

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Some other embodiments of the invention are provided as follows. It should be noted that the reference numerals and part of the contents of the previous embodiment are used in the following embodiments, in which identical reference numerals indicate identical or similar components, and repeated description of the same technical contents is omitted. Please refer to the description of the previous embodiment for the omitted contents, which will not be repeated hereinafter.

It is to be understood that both the foregoing and other detailed descriptions, features and advantages are intended to be described more comprehensively by providing an embodiment accompanied with figures hereinafter. In this regard, directional terminology, such as "top," "bottom," "left," "right," "front," and "back," is used with reference to the orientation of the figure(s) being described. Thus, the directional terminology is not intended to limit the scope of the disclosure. Briefly, the disclosure provides a spectrometer engine that identifies an identity of the replaceable spectral sampling module when connected to different replaceable sampling modules and accordingly adjusts the setting parameter of a plurality of elements in the spectrometer engine to a plurality of default values. Moreover, the spectrometer engine of the disclosure recursively adjusts the setting parameters of the aforementioned elements by a certain mechanism so as to fully exert the performance of the spectrometer and optimize the measurement result of the spectrum of the object to be measured.

Figure 2A:
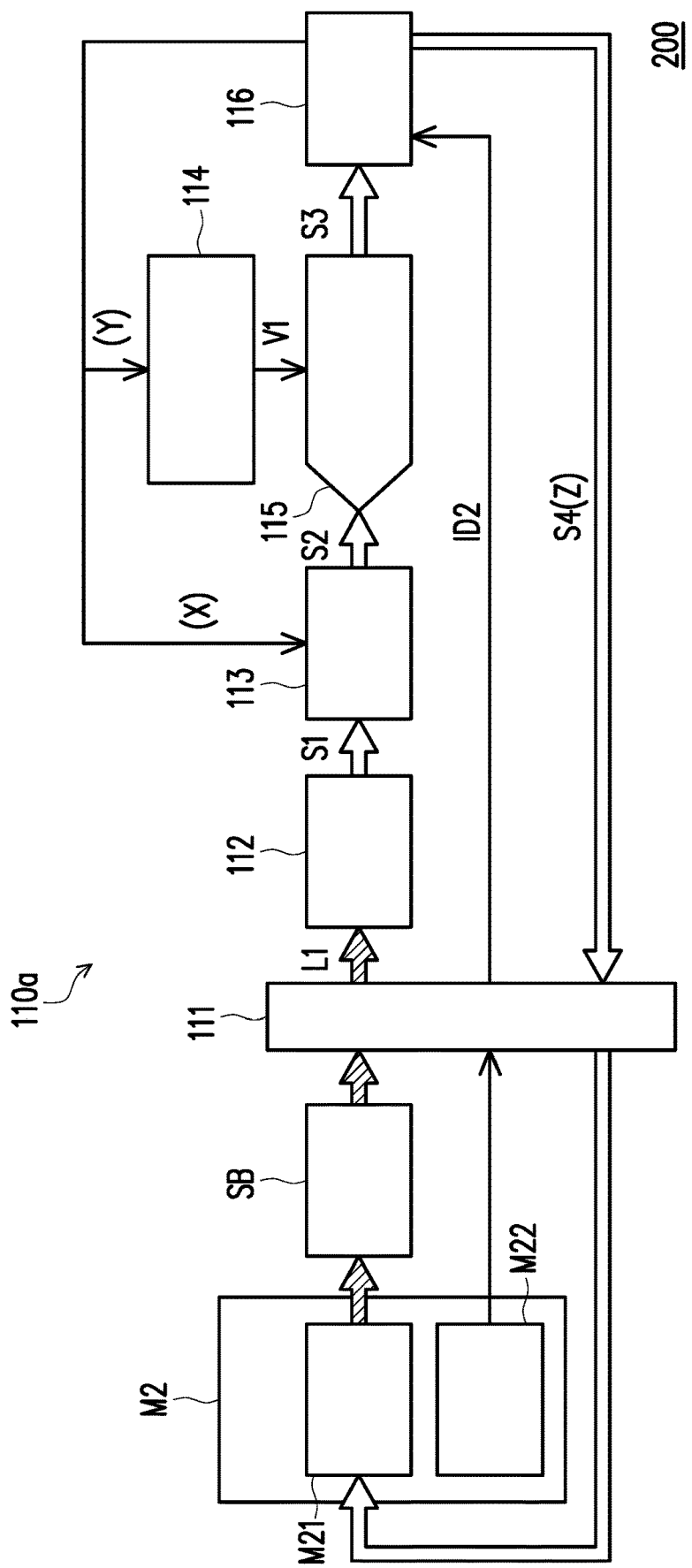
FIG. 2A is a schematic view of measuring a spectrum of an object to be measured with a spectrometer engine accompanied with a transmissive sampling module according to an embodiment of the disclosure.
Figure 2B:
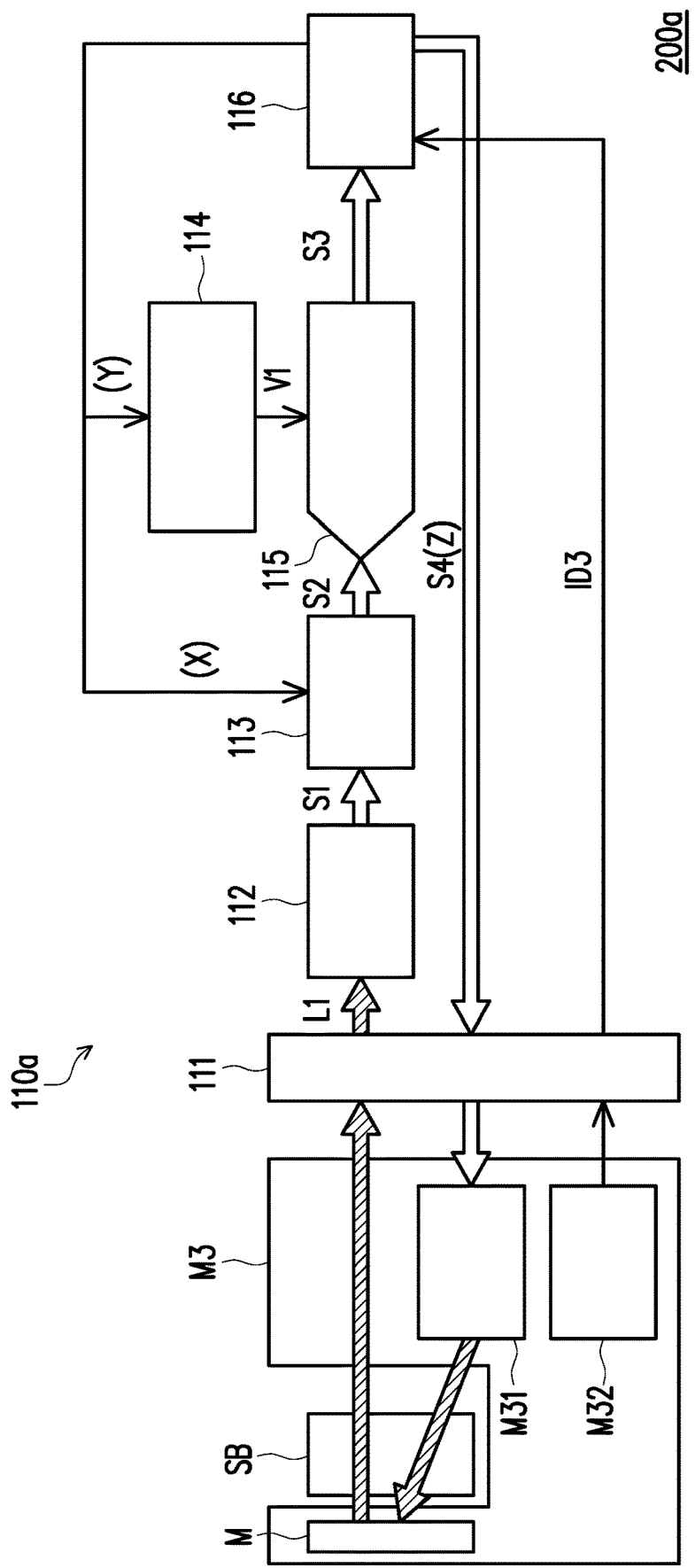
FIG. 2B is a schematic view of measuring a spectrum of an object to be measured with a spectrometer engine accompanied with a transflective sampling module according to an embodiment of the disclosure.
Figure 3:
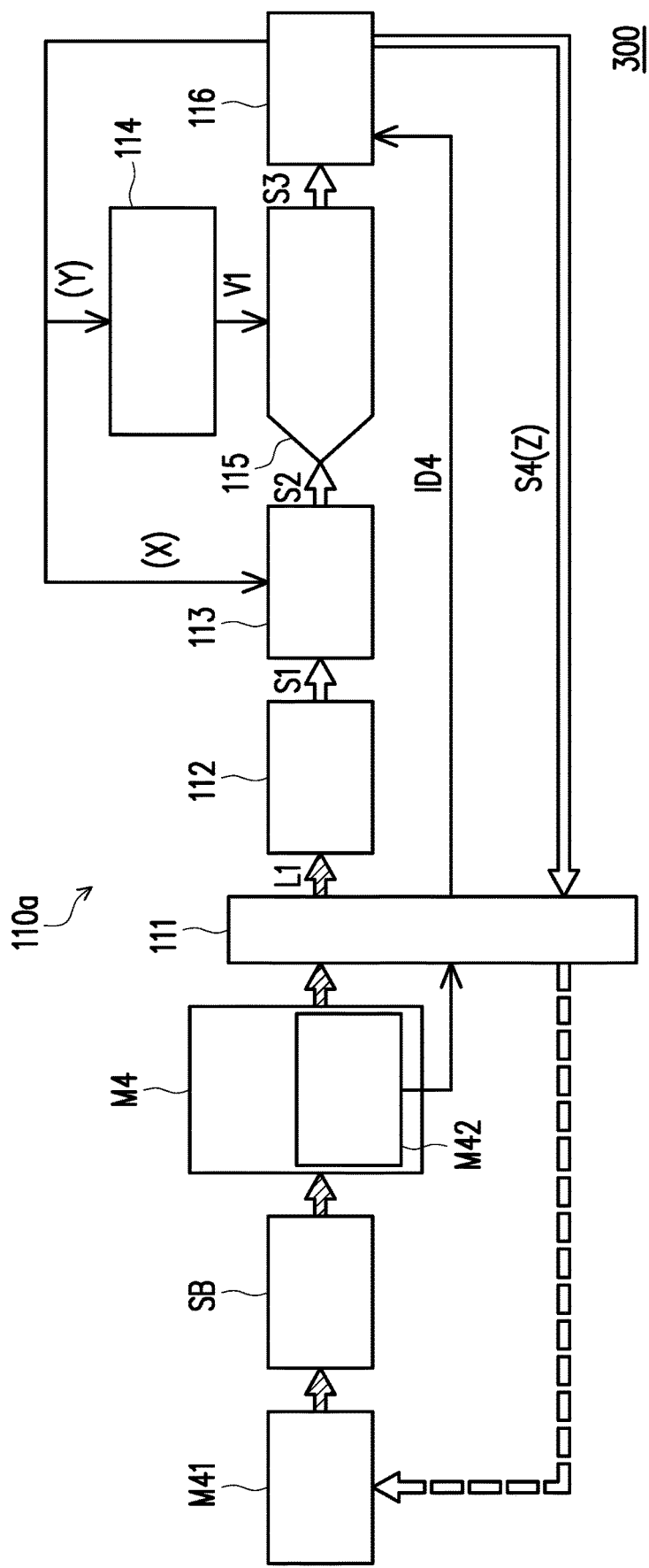
FIG. 3 is a schematic view of measuring a spectrum of an object to be measured with a spectrometer engine accompanied with an optic fiber input sampling module according to an embodiment of the disclosure.

FIG. 1, FIG. 2A, FIG. 2B and FIG. 3 are respectively schematic views of measuring a spectrum of an object to be measured with a same spectrometer engine accompanied with different replaceable spectral sampling modules according to embodiments of the disclosure. In the embodiment of FIG. 1 to FIG. 3, the spectrometer engine 110a may be respectively accompanied with a reflective sampling module M1, a transmissive sampling module M2, a transflective sampling module M3 and an optic fiber input sampling module M4 to form a spectrometer 100, a spectrometer 200, a spectrometer 200a and a spectrometer 300 for measuring a wavelength spectrum of an object to be measured SB. However, the replaceable spectral sampling module is not limited to the aforementioned modules. Any replaceable spectral sampling module that achieves the effect of the disclosure falls in the device covered by the disclosure. The details will be described below.

First, in the embodiment of FIG. 1, the spectrometer 100 may include the spectrometer engine 110a and the reflective sampling module M1, wherein the reflective sampling module M1 is a replaceable spectral sampling module for the spectrometer engine 110a. In other embodiments, the spectrometer engine 110a may also be accompanied with other spectral sampling modules for measuring the spectrum of the object to be measured SB, such as the transmissive sampling module M2 shown in FIG. 2A, the transflective sampling module M3 shown in FIG. 2B, and the optic fiber input sampling module M4 shown in FIG. 3, but spectral sampling modules are not limited thereto.

As shown in FIG. 1, the spectrometer engine 100a includes a connector 111, a light sensor 112, a variable gain amplifier 113, a variable reference voltage generation circuit 114, an analog-to-digital converter 115 and a control circuit 116. The connector 111 is adapted to connect with the reflective sampling module M1 for transmitting signals. The connector 111 is, for example, an edge-board contact or a commonly used connection device such as a universal serial bus (USB), but the disclosure is not limited thereto.

In this embodiment, the reflective sampling module M1 may sample the object to be measured SB to produce a light to be measured L1. Specifically, the reflective sampling module M1 may include a light source M11, and the light source M11 may be adapted to output an illumination beam to the object to be measured SB to sample the object to be measured SB. Thereafter, the reflective sampling module M1 may correspondingly take the illumination beam reflected by the object to be measured SB (the aforementioned illumination beam has light characteristics corresponding to the material of the object to be measured SB, that is, the aforementioned illumination beam is non-absorbable by the object to be measured SB) as the light to be measured L1 for providing/transmitting the same to the light sensor 112.

The light sensor 112 is adapted to sense the light to be measured L1 coming from the object to be measured SB and, after converting a light signal into an electrical signal, to generate a sensing signal S1. The light sensor 112 is, for example, a photo diode or a photosensitive element, a complementary metal-oxide semiconductor (CMOS), or is integrated with a circuit having a function of converting light signals and electrical signals, but the disclosure is not limited thereto.

The variable gain amplifier 113 is coupled to the light sensor 112 and amplifies the sensing signal S1 according to a first setting parameter (hereinafter referred to as X) to generate an amplified signal S2, wherein the variable gain amplifier 113 is an amplifier circuit that is well known to and can be implemented by persons skilled in the art, but the disclosure is not limited hereto. Herein, the coupling is an electrical connection for transmitting signals, for example.

The variable reference voltage generation circuit 114 provides a reference voltage V1 according to a second setting parameter (hereinafter referred to as Y). The analog-to-digital converter 115 is coupled to the variable gain amplifier 113 and the variable reference voltage generation circuit 114 and converts the amplified signal S2 to a first digital signal S3 according to the reference voltage V1 provided by the variable reference voltage generation circuit 114. The variable reference voltage generation circuit 114 and the analog-to-digital converter 115 are a voltage generation circuit and an analog-to-digital converter circuit well known to and can be implemented by persons skilled in the art, but the disclosure is not limited hereto.

The control circuit 116 is coupled to the variable gain amplifier 113, the variable reference voltage generation circuit 114 and the analog-to-digital converter 115. The control circuit 116 may read the first digital signal S3 and output a light source control signal S4 according to a third setting parameter (hereinafter referred to as Z) for the spectrometer engine 110 to measure the object to be measured SB again to generate a second digital signal.

In an embodiment, the control circuit 116 may also output the first digital signal S3 to a display device (not shown) to display a wavelength spectral distribution corresponding to the object to be measured SB.

In different embodiments, the control circuit 116 may be, for example, a central processing unit (CPU) or other programmable microprocessors for general use or special use, a digital signal processor (DSP), a programmable design controller, an application specific integrated circuit (ASIC), a programmable logic device (PLD), other similar processing devices or a combination thereof, but the disclosure is not limited thereto.

In an embodiment, when the reflective sampling module M1 is connected to the spectrometer engine 110a via the connector 111, the control circuit 116 may identify an identity of the reflective sampling module M1 through the connector 111. Specifically, as shown in FIG. 1, the reflective sampling module M1 may further include an identity circuit M12. The identity circuit M12 is connected to the control circuit 116 via the connector 111 and provides an identity signal ID1 for the control circuit 116 to read.

Thereafter, the control circuit 116 may identify an identity of the reflective sampling module M1 according to the identity signal ID1. In other words, based on the identity signal ID1, the control circuit 116 acknowledges that the replaceable spectral sampling module currently connected to the spectrometer engine 110a is the reflective sampling module M1 instead of other kinds of sampling modules. After completing identifying the identity of the reflective sampling module M1, the control circuit 116 may accordingly set the first setting parameter (i.e., X), the second setting parameter (i.e., Y) and the third setting parameter (i.e., Z) to a plurality of default values corresponding to the reflective sampling module M1.

In other words, when the reflective sampling module M1 is connected to the spectrometer engine 110a for forming the spectrometer 100, the control circuit 116 may automatically set the first setting parameter (i.e., X), the second setting parameter (i.e., Y) and the third setting parameter (i.e., Z) to a plurality of default values corresponding to the reflective sampling module M1, and manual setting is thus not required. As such, the spectrometer engine 110a may provide a more convenient and accurate parameter adjustment mechanism, and thereby improve the related operating experience and optimize the measurement result of the spectrum of the object to be measured.

Referring to FIG. 2A, the spectrometer engine 110a therein may be accompanied with the transmissive sampling module M2 to form a spectrometer 200. Compared with the spectrometer 100 of FIG. 1, the only difference is that the spectrometer engine 110a of FIG. 2A is accompanied with the transmissive sampling module M2 for measuring the wavelength spectrum of the object to be measured SB. From another perspective, the spectrometer 200 of FIG. 2A may be regarded as the spectrometer engine 110a of FIG. 1 but connected to the transmissive sampling module M2 instead of connected to the reflective sampling module M1. Therefore, relevant details of the spectrometer engine 110a may be inferred from the related descriptions of FIG. 1 and are not repeated hereinafter.

In this embodiment, the transmissive sampling module M2 may sample the object to be measured SB to generate a light to be measured L1. Specifically, the transmissive sampling module M2 may include a light source M21, and the light source M21 may be adapted to output an illumination beam to the object to be measured SB to sample the object to be measured SB. Thereafter, the transmissive sampling module M2 may correspondingly take the illumination beam transmitting through the object to be measured SB (the aforementioned illumination beam has light characteristics corresponding to the material of the object to be measured SB) as the light to be measured L1 for providing the same to the light sensor 112.

Also, similar to the embodiment of FIG. 1, when the transmissive sampling module M2 is connected to the spectrometer engine 110a via the connector 111, the control circuit 116 may identify an identity of the transmissive sampling module M2 through the connector 111. Specifically, as shown in FIG. 2A, the transmissive sampling module M2 may further include an identity circuit M22. The identity circuit M22 is connected to the control circuit 116 via the connector 111 and provides an identity signal ID2 for the control circuit 116 to read. Thereafter, the control circuit 116 may identify an identity of the transmissive sampling module M2 according to the identity signal ID2. In other words, based on the identity signal ID2, the control circuit 116 may acknowledge that the replaceable spectral sampling module currently connected to the spectrometer engine 110a is the transmissive sampling module M2 instead of other kinds of sampling modules. After completing identifying the identity of the transmissive sampling module M2, the control circuit 116 may accordingly set the first setting parameter (i.e., X), the second setting parameter (i.e., Y) and the third setting parameter (i.e., Z) to a plurality of default values corresponding to the transmissive sampling module M2.

In other words, when the transmissive sampling module M2 is connected to the spectrometer engine 110a for forming the spectrometer 200, the control circuit 116 may automatically set the first setting parameter (i.e., X), the second setting parameter (i.e., Y) and the third setting parameter (i.e., Z) to a plurality of default values corresponding to the transmissive sampling module M2, and manual setting is thus not required. As such, the spectrometer engine 110a may provide a more convenient and accurate parameter adjustment mechanism, and thereby improve the related operating experience and optimize the measurement result of the spectrum of the object to be measured.

Referring to FIG. 2B, the spectrometer engine 110a therein may be accompanied with the transflective sampling module M3 to form a spectrometer 200a. Compared with the spectrometer 100 of FIG. 1, the only difference is that the spectrometer engine 200a of FIG. 2B is accompanied with the transflective sampling module M3 for measuring the wavelength spectrum of the object to be measured SB. From another perspective, the spectrometer 200 of FIG. 2B may be regarded as the spectrometer engine 110a of FIG. 1 but connected to the transflective sampling module M3 instead of connected to the reflective sampling module M1. Therefore, relevant details of the spectrometer engine 110a may be inferred from the related descriptions of FIG. 1 and are not repeated hereinafter.

In this embodiment, the transflective sampling module M3 may sample the object to be measured SB to produce a light to be measured L1. Specifically, the transflective sampling module M3 may include a light source M31, and the light source M31 may be adapted to output an illumination beam to the object to be measured SB to sample the object to be measured SB. Thereafter, the transflective sampling module M3 may correspondingly take the illumination beam transmitting through the object to be measured SB, reflected by a reflective mirror M and then transmitting through the object to be measured SB again (the aforementioned illumination beam has light characteristics corresponding to the material of the object to be measured SB) as the light to be measured L1 for providing the same to the light sensor 112.

Also, similar to the embodiment of FIG. 1, when the transflective sampling module M3 is connected to the spectrometer engine 110a via the connector 111, the control circuit 116 may identify an identity of the transflective sampling module M3 through the connector 111. Specifically, as shown in FIG. 2B, the transflective sampling module M3 may further include an identity circuit M32. The identity circuit M32 is connected to the control circuit 116 via the connector 111 and provides an identity signal ID3 for the control circuit 116 to read. Thereafter, the control circuit 116 may identify the identity of the transflective sampling module M3 according to the identity signal ID3. In other words, based on the identity signal ID3, the control circuit 116 may acknowledge that the replaceable spectral sampling module currently connected to the spectrometer engine 110a is the transflective sampling module M3 instead of other kinds of sampling modules. After completing identifying the identity of the transflective sampling module M3, the control circuit 116 may accordingly set the first setting parameter (i.e., X), the second setting parameter (i.e., Y) and the third setting parameter (i.e., Z) to a plurality of default values corresponding to the transflective sampling module M3.

In other words, when the transflective sampling module M3 is connected to the spectrometer engine 110a for forming the spectrometer 200a, the control circuit 116 may automatically set the first setting parameter (i.e., X), the second setting parameter (i.e., Y) and the third setting parameter (i.e., Z) to a plurality of default values corresponding to the transflective sampling module M3, and manual setting is thus not required. As such, the spectrometer engine 110a may provide a more convenient and accurate parameter adjustment mechanism, and thereby improve the related operating experience and optimize the measurement result of the spectrum of the object to be measured.

Referring to FIG. 3, the spectrometer engine 110a therein may be accompanied with the optic fiber input sampling module M4 to form a spectrometer 300. Compared with the spectrometer 100 of FIG. 1 and the spectrometer 200 of FIG. 2A, the only difference is that the spectrometer engine 110a of FIG. 3 is accompanied with the optic fiber input sampling module M4 for measuring the wavelength spectrum of the object to be measured SB. From another perspective, the spectrometer 300 of FIG. 3 may be regarded as the spectrometer engine 110a of FIG. 1 but connected to the optic fiber input sampling module M4 instead of connected to the reflective sampling module M1. Therefore, relevant details of the spectrometer engine 110a may be inferred from the related descriptions of FIG. 1 and are not repeated hereinafter.

In this embodiment, the optic fiber input sampling module M4 may sample the object to be measured SB to generate a light to be measured L1. Specifically, the optic fiber input sampling module M4 includes, for example, an optic fiber cable, and the optic fiber cable (not shown in FIG. 3) collects the light to be measured L1. The light to be measured L1 may be, for example, a reflected light generated by an ambient light illuminating on and reflected by the measured SB, but the disclosure is not limited thereto. In other embodiments, the light to be measured L1 may also be, for example, a light provided by a specific light source M41 (such as a tungsten lamp) illuminating on and reflected by the measured SB. In addition, the specific light source M41 may also adjust the intensity of the illumination light by receiving the light source control signal S4. In detail, when the replaceable spectral sampling module is the optic fiber input sampling module M4, the specific light source M41 is disposed externally in the environment. The specific light source M41 may receive the light source control signal S4 from the control circuit 116 through the connector 111 and adjust the illumination beam for sampling the object to be measured SB according to the light source control signal S4.

Also, similar to the embodiment of FIG. 1, when the optic fiber input sampling module M4 is connected to the spectrometer engine 110a via the connector 111, the control circuit 116 may identify an identity of the optic fiber input sampling module M4 through the connector 111. Specifically, as shown in FIG. 3, the optic fiber input sampling module M4 may further include an identity circuit M42. The identity circuit M42 is connected to the control circuit 116 via the connector 111 and provides an identity signal ID4 for the control circuit 116 to read. Thereafter, the control circuit 116 may identify the identity of the optic fiber input sampling module M4 according to the identity signal ID4. In other words, based on the identity signal ID4, the control circuit 116 may acknowledge that the replaceable spectral sampling module currently connected to the spectrometer engine 110a is the optic fiber input sampling module M4 instead of other kinds of sampling modules. After completing identifying the identity of the optic fiber input sampling module M4, the control circuit 116 may accordingly set the first setting parameter (i.e., X), the second setting parameter (i.e., Y) and the third setting parameter (i.e., Z) to a plurality of default values corresponding to the optic fiber input sampling module M4.

In other words, when the optic fiber input sampling module M4 is connected to the spectrometer engine 110a for forming the spectrometer 300, the control circuit 116 may automatically set the first setting parameter (i.e., X), the second setting parameter (i.e., Y) and the third setting parameter (i.e., Z) to a plurality of default values corresponding to the optic fiber input sampling module M4, and manual setting is thus not required. As such, the spectrometer engine 110a may provide a more convenient and accurate parameter adjustment mechanism, and thereby improve the related operating experience and optimize the measurement result of the spectrum of the object to be measured.

Figure 4C:
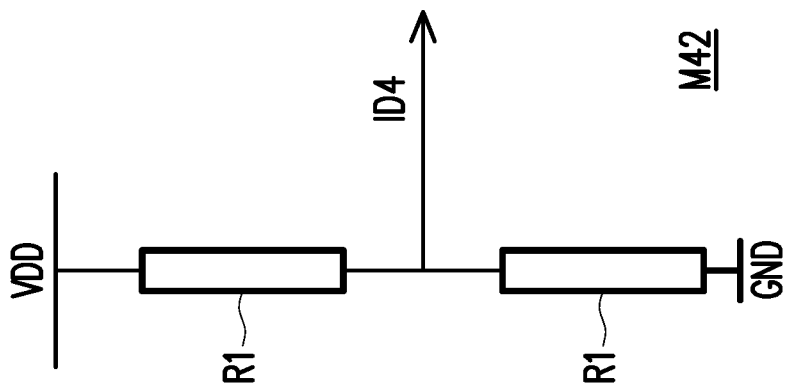
FIG. 4C is a schematic view of another identity circuit according to one embodiment of the disclosure.
Figure 4B:
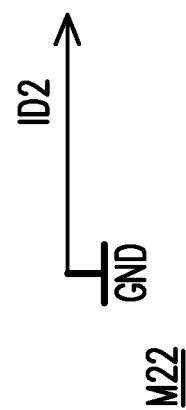
FIG. 4B is a schematic view of another identity circuit according to one embodiment of the disclosure.
Figure 4A:
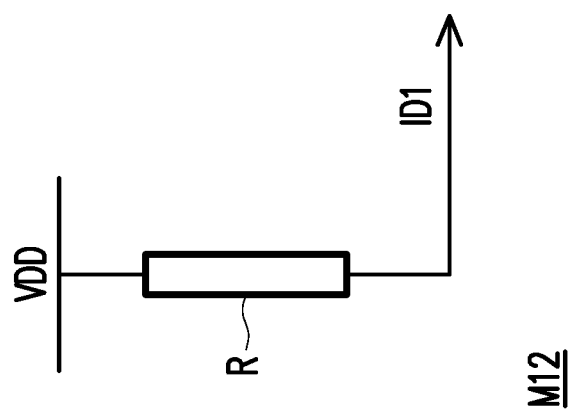
FIG. 4A is a schematic view of an identity circuit according to one embodiment of the disclosure.

FIG. 4A to FIG. 4C are schematic views of different identity circuits according to embodiments of the disclosure. The identification circuits M12, M22, M32 and M42 of the replaceable spectral sampling module according to different embodiments of the disclosure, such as the reflective sampling module M1, the transmissive sampling module M2, the transflective sampling module M3 and the fiber input sampling module M4, may be different identity circuits represented by FIG. 4A to FIG. 4C, for example, but are not limited thereto.

Referring to FIG. 4A, FIG. 4A is a schematic view of an identity circuit according to the embodiment of FIG. 1. In FIG. 4A, the identity circuit M12 may include a power source VDD and a resistor R. A first end of the resistor R may be coupled to the power source VDD, and a second end of the resistor R may be connected to the connector 111 of FIG. 1 to provide the identity signal ID1 (having a voltage value that is, for example, equal to a voltage value of the power supply VDD) via the connector 111 to the control circuit 116.

Referring to FIG. 4B, FIG. 4B is a schematic view of an identity circuit according to the embodiment of FIG. 2A. In FIG. 4B, the identity circuit M22 may include a ground terminal GND. The ground terminal GND may be connected to the connector 111 of FIG. 2A, to provide the identity signal ID2 (having a voltage value of 0, for example) via the connector 111 to the control circuit 116.

Referring to FIG. 4C, FIG. 4A is a schematic view of an identity circuit according to the embodiment of FIG. 3. In FIG. 4C, the identity circuit M42 may include a power source VDD, a resistor R1 and a resistor R2. A first end of the resistor R1 is coupled to the power source VDD, a second end of the resistor R1 is coupled to the first end of the resistor R2 and the connector 111 of FIG. 3, and the second end of the resistor R2 is coupled to the ground terminal GND. As shown in FIG. 4C, the identity circuit M42 may provide the identity signal ID4 (having a voltage value that is, for example, equal to a voltage value of after divided by the resistor R1 and the resistor R2) via the second end of the resistor R1 to the control circuit 116. In an embodiment, when an average value of the resistances of the resistor R1 and the resistor R2 are equal, the voltage value of the identity signal ID4 is, for example, half of the power source VDD, but is not limited thereto.

Although FIG. 4A, FIG. 4B and FIG. 4C are respectively assumed to correspond to the identity circuits M12, M22, M32 and M42, in other embodiments, the designer may also adjust the correspondence relationship between FIG. 4A, FIG. 4B and FIG. 4C and the identity circuits M12, M22, M32 and M42 according to requirements. For example, the arrangement of FIG. 4A may be used to implement the identity circuit M22 of FIG. 2A, the arrangement of FIG. 4B may be used to implement the identity circuit M42 of FIG. 3, and the arrangement of FIG. 4C may be used to implement the identity circuit M11 of FIG. 1, and so on, but the disclosure is not limited thereto.

Figure 5:
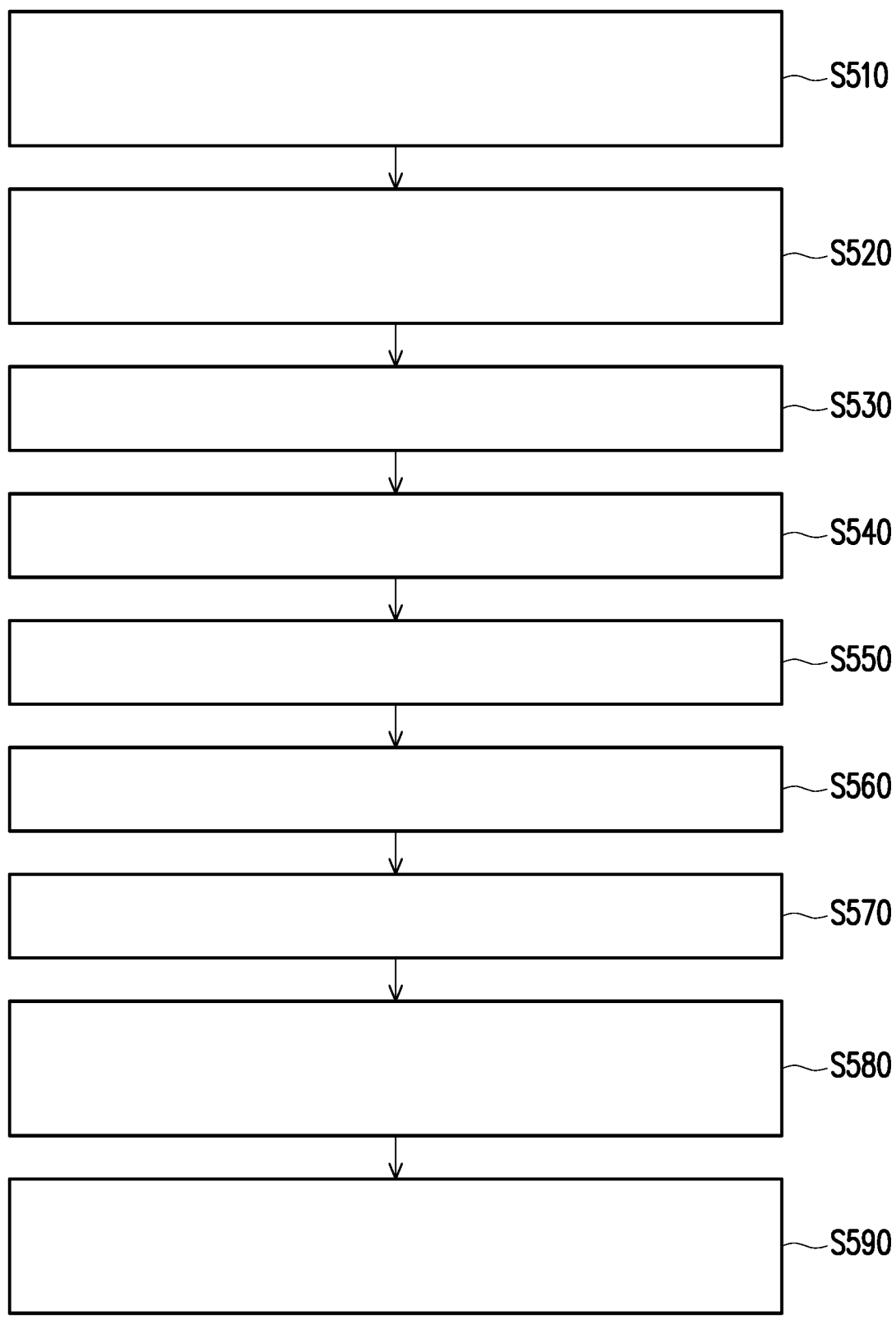
FIG. 5 is a flowchart of an adjustment method according to an embodiment of the disclosure.

Referring to FIG. 5, FIG. 5 is a flowchart of an adjustment method according to an embodiment of the disclosure. The method disclosed in this embodiment is adapted for the spectrometer engine 110a as shown in FIG. 1, FIG. 2A, FIG. 2B and FIG. 3. Each of the steps of the method are described below with reference to the elements as shown in FIG. 1 to FIG. 3.

First, in step S510, when the replaceable spectral sampling module is connected to the connector 111, the control circuit 116 identifies an identity of the replaceable spectral sampling module through the connector 111. Then, in step S520, the control circuit 116 may set a first setting parameter (i.e., X), a second setting parameter (i.e., Y) and a third setting parameter (i.e., Z) to a plurality of default values corresponding to the replaceable spectral sampling module according to the identity of the replaceable spectral sampling module.

Figure 6:
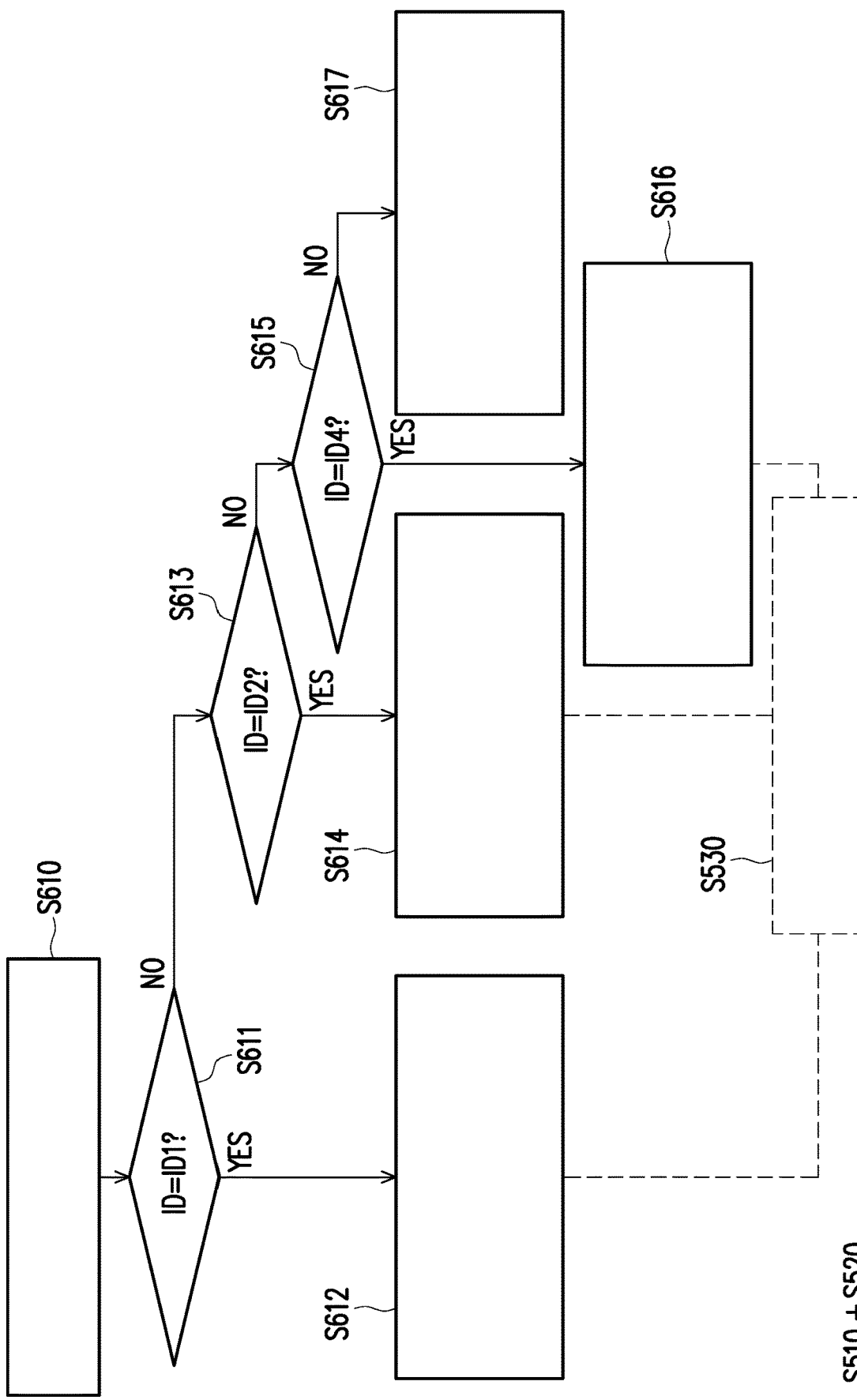
FIG. 6 is a flowchart of identifying an identity of a replaceable spectral sampling module and loading a default value of a corresponding setting parameter according to FIG. 5.

As described in the previous embodiments, the replaceable spectral sampling module in step S510 may be one of the reflective sampling module M1 of FIG. 1, the transmissive sampling module M2 of FIG. 2A, the transflective sampling module M3 of FIG. 2B and the optic fiber input sampling module M4 of FIG. 3, and details of the control circuit 116 performing steps S510 and S520 may be as shown in FIG. 6.

Referring to FIG. 6, FIG. 6 is a flowchart of identifying an identity of a replaceable spectral sampling module and loading a default value of a corresponding setting parameter according to FIG. 5. Herein, the reflective sampling module M1 of FIG. 1, the transmissive sampling module M2 of FIG. 2A and the optic fiber input sampling module M4 of FIG. 3 are taken as examples of the replaceable spectral sampling module. The method of this embodiment may be performed by the control circuit 116 of FIG. 1 to FIG. 3. Specifically, in step S610, the control circuit 116 may read the identity signal (hereinafter referred to as ID) of the replaceable spectral sampling module connected to the control circuit 116. Then, in step S611, the control circuit 116 may determine whether ID is equivalent to the identity signal ID1 of the reflective sampling module M1. If yes, the control circuit 116 may proceed to perform step S612 to set the first setting parameter (i.e., X), the second setting parameter (i.e., Y) and the third setting parameter (i.e., Z) to a plurality of default values of the reflective sampling module M1, and proceed to perform step S530 in FIG. 5.

In step S611, If the ID is determined not equivalent to the identity signal ID1 of the reflective sampling module M1, the control circuit 116 may proceed to perform step S613 to determine whether ID is equivalent to the identity signal ID2 of the transmissive sampling module M2. If yes, the control circuit 116 may proceed to perform step S614 to set the first setting parameter (i.e., X), the second setting parameter (i.e., Y) and the third setting parameter (i.e., Z) to a plurality of default values corresponding to the transmissive sampling modules M2, and proceed to perform step S530 in FIG. 5.

In step S613, if the ID is determined not equivalent to the identity signal ID2 of the transmissive sampling modules M2, the control circuit 116 may proceed to perform step S615 to determine whether the ID is equivalent to the identity signal ID4 of the optic fiber input sampling module M4. If yes, the control circuit 116 may proceed to perform step S616 to set the first setting parameter (i.e., X), the second setting parameter (i.e., Y) and the third setting parameter (i.e., Z) to a plurality of default values of the optic fiber input sampling module M4, and proceed to perform step S530 in FIG. 5.

In step S615, if ID is determined not equivalent to the identity signal ID4 of the optic fiber input sampling module M4, the control circuit 116 may proceed to perform step S617 to determine that the identity of the replaceable spectral sampling module connected to the control circuit 116 is not recognizable.

Referring to FIG. 5 again, after performing step S520 to set the first setting parameter (i.e., X), the second setting parameter (i.e., Y) and the third setting parameter (i.e., Z) to be corresponded to a plurality of default values corresponding to the replaceable spectral sampling module, the replaceable spectral sampling module may sample an object to be measured SB to generate a light to be measured L1 in step S530.

In step S540, a light sensor 112 may sense the light to be measured L1 coming from the object to be measured SB to generate a sensing signal S1. In step S550, a variable gain amplifier 113 may amplify the sensing signal S1 according to a first setting parameter (i.e., X) to generate an amplified signal S2. In step S560, a variable reference voltage generation circuit 114 may provide a reference voltage V1 according to a second setting parameter (i.e., Y). In step S570, an analog-to-digital converter 115 may convert the amplified signal S2 to a first digital signal S3 according to the reference voltage V1.

Details of step S530 to step S570 may be referred to in the above embodiments and therefore not repeated herein.

In step S580, the control circuit 116 may read the first digital signal S3 and adjust at least one of the first setting parameter (i.e., X), the second setting parameter (i.e., Y) and the third setting parameter (i.e., Z) according to the first digital signal S3. Moreover, in step S590, the control circuit 116 may output a light source control signal S4 according to the third setting parameter (i.e., Z) for the spectrometer engine 110a to measure the object to be measured SB again to generate a second digital signal.

In this embodiment, the first digital signal S3 and the second digital signal may be regarded as two spectrum digital signals consecutively obtained by the spectrometer engine 110a on the object to be measured SB. For convenience of explaining the concept of the disclosure, in the following descriptions, one of the spectrum digital signals obtained by the spectrometer engine 110a is referred to as A in general.

In an embodiment, the control circuit 116 may determine whether a first digital signal S3 (i.e., A) is between an upper limit value (hereinafter referred to as $B_{max}$) and a lower limit value (hereinafter referred to as $B_{min}$) or not. In this embodiment, $B_{max}$ and $B_{min}$ define a maximum allowable dynamic range of A. Therefore, if A is between $B_{max}$ and $B_{min}$, it means that the first setting parameter (i.e., X), the second setting parameter (i.e., Y) and the third setting parameter (i.e., Z) are suitable for the spectrometer engine 110a to measure the object to be measured SB accordingly and may achieve better measurement results.

In addition, if the control circuit 116 determines that A is between $B_{max}$ and $B_{min}$, the control circuit 116 determines that an adjustment to the first setting parameter (i.e., X), the second setting parameter (i.e., Y) and the third setting parameter (i.e., Z) is completed for the spectrometer engine 110a to measure the object to be measured SB to generate a second digital signal (i.e., a newly-obtained A) according to the first setting parameter (i.e., X), the second setting parameter (i.e., Y) and the third setting parameter (i.e., Z).

On the other hand, if the first digital signal S3 is not between $B_{max}$ and $B_{min}$, the control circuit 116 may determine whether one (hereinafter referred to as particular parameter) of the first setting parameter (i.e., X), the second setting parameter (i.e., Y) and the third setting parameter (i.e., Z) is equal to the threshold value or not. If not, the control circuit 116 may adjust the particular parameter. In other words, the control circuit 116 may adjust the particular parameter according to the currently-measured A, such that the A obtained next time presents a different aspect. Specific descriptions are provided hereinafter with reference to the first, the second and the third embodiments.

In the first embodiment, if the particular parameter initially considered by the control circuit 116 is Y, the control circuit 116 may determine whether Y is equal to the threshold value ($Y_{min}$, for example) or not. If not, the control circuit 116 may, for example, lower the second setting parameter (i.e., Y). As such, the variable reference voltage generation circuit 114 may adjust the reference voltage V1 provided to the analog-to-digital converter 115 in response to the lowered Y and thereby change the aspect of the second digital signal.

In the first embodiment, before the first digital signal S3 is generated, it is assumed that the amplified signal S2 input to the analog-to-digital converter 115 is 1 volt, and the reference voltage V1 to which the analog-to-digital converter 115 performs an analog-to-digital conversion operation accordingly is 2 volts. However, after the first digital signal S3 is generated, it is assumed that the control circuit 116 changes the value of the reference voltage V1 from 2 volts to 1 volt by lowering Y. As such, since the reference voltage V1 changes from double of the amplified signal S2 to the same as the amplified signal S2, the second digital signal output by the analog-to-digital converter 115 becomes double of the first digital signal S3. In short, if the control circuit 116 lowers the reference voltage V1 to half according to the currently-measured A, the A obtained by the spectrometer engine 110a next time will be double of the A as obtained in the previous time.

In other embodiments, the control circuit 116 may lower Y in a different magnitude each time according to the designer's requirement, for example, lowering 3% of the previous Y, but the disclosure is not limited thereto.

In the second embodiment, if the particular parameter initially considered by the control circuit 116 is X, the control circuit 116 may determine whether X is equal to the threshold value ($X_{max}$, for example) or not. If not, the control circuit 116 may, for example, raise the X. As such, the variable gain amplifier 113 may adjust the gain ratio for amplifying the sensing signal S1 to the amplified signal S2 in response to the raised X and thereby change the aspect of the second digital signal.

In the second embodiment, before the first digital signal S3 is generated, it is assumed that a gain ratio of the variable gain amplifier 113 is one. However, after the first digital signal S3 is generated, it is assumed that the control circuit 116 changes the gain ratio of the variable gain amplifier 113 from one to two by raising X. As such, the second digital signal output by the analog-to-digital converter 115 becomes double of the first digital signal S3. In short, if the control circuit 116 doubles the gain ratio of the variable gain amplifier 113 according to the currently-measured A, the A obtained by the spectrometer engine 110a next time will be double of the A obtained in the previous time.

In other embodiments, the control circuit 116 may raise X in a different magnitude each time according to the designer's requirements, for example, raising to four times of the previous X, but the disclosure is not limited thereto.

In the third embodiment, if the particular parameter initially considered by the control circuit 116 is Z, the control circuit 116 may determine whether Z is equal to the threshold value ($Z_{max}$, for example) or not. If not, the control circuit 116 may, for example, raise Z. As such, the variable gain amplifier 113 may correspondingly adjust the light source control signal S4 for controlling the brightness of the light source (such as the light source M11 of FIG. 1 and the light source M21 of FIG. 2A) and thereby change the aspect of the second digital signal.

In the third embodiment, before the first digital signal S3 is generated, it is assumed that the brightness of the light source connected to the spectrometer engine 110a (such as the light source M11 of FIG. 1 and the light source M21 of FIG. 2A) is 80%, and after the first digital signal S3 is generated, it is assumed that the control circuit 116 increases the brightness of the light source to 90% by raising Z. As such, the illumination beam emitted on the object to be measured SB becomes brighter, and the spectrometer engine 110a correspondingly obtains the second digital signal in a different aspect. In short, if the control circuit 116 increases the brightness of the light source according to the currently-measured A, the A obtained by the spectrometer engine 110a next time will change correspondingly.

In other embodiments, the control circuit 116 may raise Z in a different magnitude each time according to the designer's requirements, for example, raising 5% of the previous Z, but the disclosure is not limited thereto.

In addition, further to the first, the second and the third embodiments, after the second digital signal is obtained, the control circuit 116 may determine again whether the second digital signal is between $B_{max}$ and $B_{min}$ or not. If not, the control circuit 116 proceeds to determine whether the particular parameter considered is equal to the threshold value or not. If the control circuit 116 determines that the particular parameter considered is equal to the threshold value, the control circuit 116 may select other setting parameters for adjustment, and correspondingly have the spectrometer engine 110a measure the object to be measured SB again to generate a third digital signal (i.e., a newly-obtained A obtained after the second digital signal).

For example, if the particular parameter initially considered by the control circuit 116 is Y, after the second digital signal is obtained, the control circuit 116 may determine whether the second digital signal is between $B_{max}$ and $B_{min}$ or not. If not, the control circuit 116 may proceed to determine whether Y is equal to $Y_{min}$ or not. If yes, it means that Y has no room for further adjustment, so the control circuit 116 may, for example, select X as the particular parameter to be considered next, and may perform relevant adjustments on X based on the teaching in the second embodiment. Thereafter, the control circuit 116 may correspondingly have the spectrometer engine 110a measure the object to be measured SB again to generate a third digital signal.

In other embodiments, If the control circuit 116 determines that Y is equal to $Y_{min}$, the control circuit 116 may also select Z as the particular parameter to be considered next, and may perform relevant adjustments on Z based on the teaching in the third embodiment. Thereafter, the control circuit 116 may correspondingly have the spectrometer engine 110a measure the object to be measured SB again to generate a third digital signal.

In different embodiments, the designer may adjust the order of considering X, Y or Z as the particular parameter according to the requirements, and the disclosure is not limited to the above embodiments. For example, the designer may have the control circuit 116 first take X as the particular parameter initially considered, and take Z as the particular parameter to be considered next after X is raised to $X_{max}$. Then, if Z is also raised to $Z_{max}$ after several A are obtained consecutively, the control circuit 116 may take Y as the particular parameter to be considered next until Y is also lowered to $Y_{min}$.

In an embodiment, if X, Y and Z are successively adjusted to corresponding threshold values, the control circuit 116 may send a warning message to remind the operator that X, Y and Z have no room for further adjustment; in other words, there may be no other way for the subsequently measured A to fall between $B_{max}$ and $B_{min}$. Moreover, the control circuit 116 may further provide a ratio of A to $B_{max}$ and/or $B_{min}$ to let the operator know the difference between the current A and $B_{max}$ and/or $B_{min}$.

Figure 7:
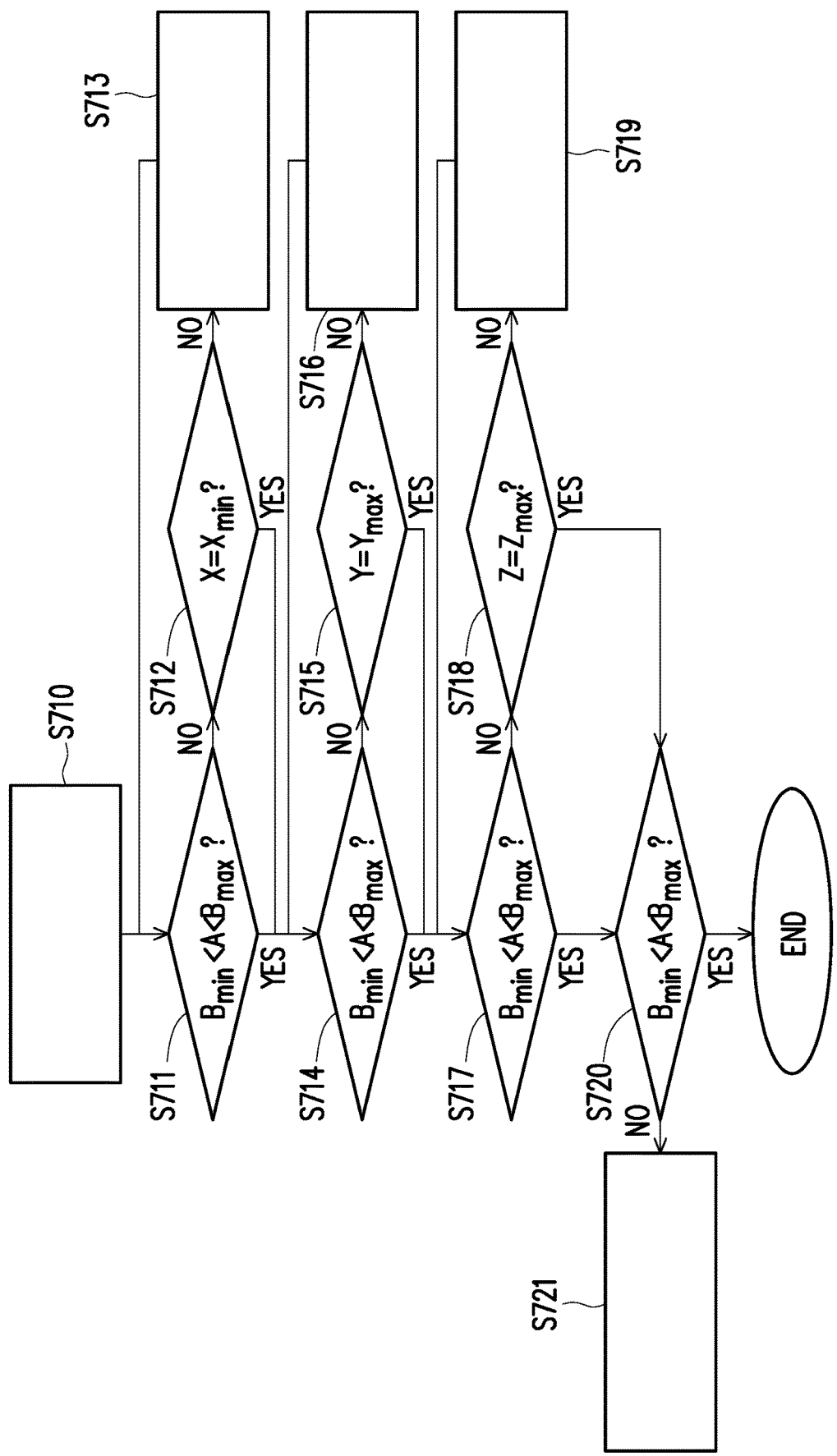
FIG. 7 is a flowchart of an adjustment method of a spectrometer engine according to an embodiment of the disclosure.

In order to explain the above concept more clearly, the following is described with reference to FIG. 7. Referring to FIG. 7, FIG. 7 is a flowchart of an adjustment method of a spectrometer engine according to an embodiment of the disclosure. In this embodiment, it is assumed that the control circuit 116 sequentially takes X, Y and Z as the particular parameter to be considered.

First, in step S710, the control circuit 116 may read a digital signal (i.e., A) output by the analog-to-digital converter 115, as described in the above embodiment. Then, in step S711, the control circuit 116 may determine whether A is between $B_{max}$ and $B_{min}$ or not. If yes, it means that X, Y and Z have been adjusted to proper values, so the control circuit 116 may directly proceed to perform step S714, step S717 and step S720. In other words, the control circuit 116 may no longer adjust X, Y, and Z and may measure the object to be measured SB based on X, Y, and Z.

However, if in step S711 the control circuit 116 determines that A is not between $B_{max}$ and $B_{min}$, the control circuit 116 may proceed to perform step S712 to determine whether Y is equal to $Y_{min}$ or not. If not, the control circuit 116 may proceed to perform S713 to lower Y and read a newly-obtained digital signal (i.e., A) and return to step S711. Details of the control circuit 116 lowering Y may be referred to in the first embodiment as above and therefore not repeated herein.

If in step S712 the control circuit 116 determines that Y is equal to $Y_{min}$, it means that Y has no room for further adjustment, and the control circuit 116 may proceed to step S714 to determine whether A is between $B_{max}$ and $B_{min}$ or not. If not, the control circuit 116 may perform step S715 to determine whether X is equal to $X_{max}$ or not. If not, the control circuit 116 may perform S716 to raise X and read a newly-obtained digital signal (i.e., A) and return to step S714. Details of the control circuit 116 raising X may be referred to in the second embodiment as above and therefore not repeated herein.

If in step S715 the control circuit 116 determines that X is equal to $X_{max}$, it means that X has no room for further adjustment, and the control circuit 116 may proceed to perform step S717 to determine whether A is between $B_{max}$ and $B_{min}$ or not. If not, the control circuit 116 may perform step S718 to determine whether Z is equal to $Z_{max}$ or not. If not, the control circuit 116 may perform S719 to raise Z and read a newly-obtained digital signal (i.e., A) and return to step S717. Details of the control circuit 116 raising Z may be referred to in the third embodiments as above and therefore not repeated herein.

If in step S718 the control circuit 116 determines that Z is equal to $Z_{max}$, it means that Z has no room for further adjustment, and the control circuit 116 may proceed to perform step S720 to determine whether A is between $B_{max}$ and $B_{min}$ or not. If not, it means that X, Y and Z have been successively adjusted to corresponding threshold values, so the control circuit 116 may perform step S721 to send a warning message to remind the operator that X, Y and Z have no room for further adjustment. In other words, there may be no other way for the subsequently obtained A to fall between $B_{max}$ and $B_{min}$. Moreover, the control circuit 116 may further provide a ratio of A to $B_{max}$ and/or $B_{min}$ to let the operator know the difference between the current A and $B_{max}$ and/or $B_{min}$.

In different embodiments, when a different replaceable spectral sampling module is connected to the spectrometer engine 110a, the control circuit 116 may further load $B_{max}$ and $B_{min}$ corresponding to the replaceable spectral sampling module connected to the control circuit 116. In other words, the control circuit 116 may set different $B_{max}$ and $B_{min}$ for different replaceable spectral sampling modules. As such, X, Y, Z and other parameters may be adjusted to better match the operational characteristics of the replaceable spectral sampling module, and the subsequent measurement results of the spectrometer engine 110a of the object to be measured SB may be thereby optimized.

In different embodiments, each of the above described upper limit values, lower limit values and threshold values may be set to any desired value depending on the designer's consideration.

In summary, the spectrometer engine and an adjustment method thereof provided identifies an identity of the replaceable spectral sampling module when the spectrometer engine is connected to different replaceable sampling modules and accordingly adjusts the setting parameters of the variable gain amplifier, the variable reference voltage generation circuit and the light source control signal in the spectrometer engine to default values corresponding to the replaceable spectral sampling module connected to spectrometer engine. As such, it is not required to manually set the above setting parameters, and the related operating experience is thereby improved by providing a more convenient and accurate parameter adjustment mechanism. Also, the performance of the spectrometer engine is fully exerted through the automatic adjustment setting of the disclosure.

Moreover, after obtaining the spectrum digital signal of the object to be measured each time, the disclosure may also determine whether the above setting parameters are suitable for the spectrometer engine to measure the object to be measured accordingly by determining whether the digital signal is between an upper limit value and a lower limit value or not. If not, the disclosure may further recursively adjust the above setting parameters in order to adjust the above setting parameters to proper values, such that the spectrum digital signal as measured approaches but does not exceed the maximum allowable dynamic range. As such, the performance of the spectrometer is fully exerted and the measurement result of the spectrum of the object to be measured is optimized.

It will be apparent to persons skilled in the art that various modifications and variations can be made to the disclosed embodiments without departing from the scope or spirit of the disclosure. In view of the foregoing, it is intended that the disclosure covers modifications and variations of this disclosure provided that they fall within the scope of the following claims and their equivalents. The embodiments described hereinbefore are chosen and described in order to best explain the principles of the disclosure and its best mode practical application. It is not intended to be exhaustive to limit the disclosure to the precise form or to the exemplary embodiments disclosed. Namely, persons skilled in the art are enabled to understand the disclosure through various embodiments with various modifications as are suited to the particular use or implementation contemplated. It is intended that the scope of the disclosure be defined by the claims appended hereto and their equivalents in which all terms are meant in their broadest reasonable sense unless otherwise indicated. Any of the embodiments or any of the claims of the disclosure does not necessarily achieve all of the advantages or features disclosed by the disclosure. Moreover, the abstract and the title of the invention are merely used to aid in search of patent files and are not intended to limit the scope of the disclosure. In addition, terms such as "first" and "second" in the specification are used only to name the elements and should not be construed as the upper limit or lower limit of the number of any element.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A spectrometer engine, comprising: a connector, a light sensor, a variable gain amplifier, a variable reference voltage generation circuit, an analog-to-digital converter and a control circuit, wherein the connector is adapted for connecting with a replaceable spectral sampling module, wherein the replaceable spectral sampling module samples an object to be measured to generate a light to be measured, the light sensor is adapted for sensing the light to be measured coming from the object to be measured to generate a sensing signal, the variable gain amplifier is coupled to the light sensor and amplifies the sensing signal according to a first setting parameter to generate an amplified signal, the variable reference voltage generation circuit provides a reference voltage according to a second setting parameter, the analog-to-digital converter is coupled to the variable gain amplifier and the variable reference voltage generation circuit and converts the amplified signal to a first digital signal according to the reference voltage, and the control circuit is coupled to the variable gain amplifier, the variable reference voltage generation circuit and the analog-to-digital converter, the control circuit reads the first digital signal, adjusts at least one of the first setting parameter, the second setting parameter and a third setting parameter according to the first digital signal, and outputs a light source control signal according to the third setting parameter for the spectrometer engine to measure the object to be measured again to generate a second digital signal.

2. The spectrometer engine of claim 1, wherein if the control circuit determines that the first digital signal is not between an upper limit value and a lower limit value, the control circuit determines whether the first setting parameter is equal to a first threshold value, if not, the control circuit raises the first setting parameter.

3. The spectrometer engine of claim 1, wherein if the control circuit determines that the first digital signal is not between the upper limit value and the lower limit value, the control circuit determines whether the second setting parameter is equal to a second threshold value, if not, the control circuit lowers the second setting parameter.

4. The spectrometer engine of claim 1, wherein if the control circuit determines that the first digital signal is not between the upper limit value and the lower limit value, the control circuit determines whether the third setting parameter is equal to a third threshold value, if not, the control circuit raises the third setting parameter.

5. The spectrometer engine of claim 1, wherein the control circuit determines whether the first digital signal is between an upper limit value and a lower limit value or not, if yes, the control circuit determines that an adjustment to the first setting parameter, the second setting parameter and the third setting parameter is completed for the spectrometer engine to measure the object to be measured to generate the second digital signal according to the first setting parameter, the second setting parameter and the third setting parameter; and if not, the control circuit determines whether one of the first setting parameter, the second setting parameter and the third setting parameter is equal to a threshold value, if not, the control circuit adjusts the one of the first setting parameter, the second setting parameter and the third setting parameter.

6. The spectrometer engine of claim 5, wherein if the control circuit determines that the second digital signal is not between the upper limit value and the lower limit value, the control circuit determines whether the one of the first setting parameter, the second setting parameter and the third setting parameter is equal to the threshold value or not, if yes, the control circuit adjusts another one of the first setting parameter, the second setting parameter and the third setting parameter and outputs another light source control signal for the spectrometer engine to measure the object to be measured again to generate a third digital signal.

7. The spectrometer engine of claim 5, wherein the upper limit value and the lower limit value correspond to the replaceable spectral sampling module.

8. The spectrometer engine of claim 1, wherein after the control circuit respectively adjusts the first setting parameter, the second setting parameter and the third setting parameter to be a first threshold value, a second threshold value and a third threshold value, the control circuit outputs a warning message.

9. The spectrometer engine of claim 1, wherein if the replaceable spectral sampling module is connected to the connector, the control circuit identifies an identity of the replaceable spectral sampling module through the connector, and accordingly sets the first setting parameter, the second setting parameter and the third setting parameter to a plurality of default values corresponding to the replaceable spectral sampling module.

10. The spectrometer engine of claim 9, wherein the replaceable spectral sampling module comprises an identity circuit, the control circuit is connected to the identity circuit via the connector to read an identity signal of the replaceable spectral sampling module and identifies the identity of the replaceable spectral sampling module according to the identity signal.

11. The spectrometer engine of claim 1, wherein the replaceable spectral sampling module comprises one of a reflective sampling module, a transmissive sampling module and an optic fiber input sampling module.

12. The spectrometer engine of claim 1, wherein if the replaceable spectral sampling module is a reflective sampling module or a transmissive sampling module, the replaceable spectral sampling module comprises a light source, wherein the light source receives the light source control signal from the control circuit via the connector and adjusts an illumination beam for sampling the object to be measured according to the light source control signal.

13. An adjustment method of a spectrometer engine, comprising:

sampling, by a replaceable spectral sampling module, an object to be measured to generate a light to be measured;

sensing, by a light sensor, the light to be measured coming from the object to be measured to generate a sensing signal;

amplifying, by a variable gain amplifier, the sensing signal according to a first setting parameter to generate an amplified signal;

providing, by a variable reference voltage generation circuit, a reference voltage according to a second setting parameter;

converting, by an analog-to-digital converter, the amplified signal to a first digital signal according to the reference voltage; and reading, by a control circuit, the first digital signal, adjusting, by the control circuit, at least one of the first setting parameter, the second setting parameter and a third setting parameter according to the first digital signal, and outputting, by the control circuit, a light source control signal according to the third setting parameter for the spectrometer engine to measure the object to be measured again to generate a second digital signal.

14. The adjustment method of the spectrometer engine of claim 13, wherein the step of adjusting the at least one of the first setting parameter, the second setting parameter and the third setting parameter according to the first digital signal comprises:
if the control circuit determines that the first digital signal is not between an upper limit value and a lower limit value, determining whether the first setting parameter is equal to a first threshold value, if not, raising the first setting parameter.

15. The adjustment method of the spectrometer engine of claim 13, wherein the step of adjusting the at least one of the first setting parameter, the second setting parameter and the third setting parameter according to the first digital signal comprises:
if the control circuit determines that the first digital signal is not between an upper limit value and a lower limit value, determining whether the second setting parameter is equal to a second threshold value, if not, lowering the second setting parameter.

16. The adjustment method of the spectrometer engine of claim 13, wherein the step of adjusting the at least one of the first setting parameter, the second setting parameter and the third setting parameter according to the first digital signal comprises:
if the control circuit determines that the first digital signal is not between an upper limit value and a lower limit value, determining whether the third setting parameter is equal to a third threshold value, if not, raising the third setting parameter.

17. The adjustment method of the spectrometer engine of claim 13, wherein the step of adjusting the at least one of the first setting parameter, the second setting parameter and the third setting parameter according to the first digital signal comprises:
determining whether the first digital signal is between an upper limit value and a lower limit value,
if yes, determining that an adjustment to the first setting parameter, the second setting parameter and the third setting parameter is completed for the spectrometer engine to measure the object to be measured to generate the second digital signal according to the first setting parameter, the second setting parameter and the third setting parameter; and
if not, determining whether one of the first setting parameter, the second setting parameter and the third setting parameter is equal to a threshold value, if not, adjusting the one of the first setting parameter, the second setting parameter and the third setting parameter.

18. The adjustment method of the spectrometer engine of claim 17, further comprising:
if the control circuit determines that the second digital signal is not between the upper limit value and the lower limit value, determining whether the one of the first setting parameter, the second setting parameter and the third setting parameter is equal to the threshold value, if yes, adjusting another one of the first setting parameter, the second setting parameter and the third setting parameter and outputting another light source control signal for the spectrometer engine to measure the object to be measured again to generate a third digital signal.

19. The adjustment method of the spectrometer engine of claim 17, wherein the upper limit value and the lower limit value correspond to the replaceable spectral sampling module.

20. The adjustment method of the spectrometer engine of claim 13, further comprising: after the first setting parameter, the second setting parameter and the third setting parameter are adjusted to a first threshold value, a second threshold value and a third threshold value respectively, outputting a warning message.

21. The adjustment method of the spectrometer engine of claim 13, wherein if the replaceable spectral sampling module is connected to the connector, the control circuit identifies an identity of the replaceable spectral sampling module through the connector, and accordingly sets the first setting parameter, the second setting parameter and the third setting parameter to a plurality of default values corresponding to the replaceable spectral sampling module.

22. The adjustment method of the spectrometer engine of claim 21, wherein the replaceable spectral sampling module comprises an identity circuit, the control circuit is connected to the identity circuit via the connector to read an identity signal of the replaceable spectral sampling module and identifies the identity of the replaceable spectral sampling module according to the identity signal.

23. The adjustment method of the spectrometer engine of claim 13, wherein the replaceable spectral sampling module comprises one of a reflective sampling module, a transmissive sampling module and an optic fiber input sampling module.

24. The adjustment method of the spectrometer engine of claim 13, wherein if the replaceable spectral sampling module is a reflective sampling module or a transmissive sampling module, the replaceable spectral sampling module comprises a light source, wherein the light source receives the light source control signal from the control circuit via the connector and adjusts an illumination beam for sampling the object to be measured according to the light source control signal.

25. The adjustment method of the spectrometer engine of claim 23, wherein if the replaceable spectral sampling module is an optic fiber input sampling module, a light source element is disposed externally in the environment, wherein the light source element receives the light source control signal from the control circuit via the connector and adjusts an illumination beam for sampling the object to be measured according to the light source control signal.

* * * * *